United States Patent [19]

Sakamoto

[11] Patent Number: 5,200,835
[45] Date of Patent: Apr. 6, 1993

[54] DEMODULATOR FOR FM MODULATED VIDEO SIGNALS WITH PRE-DEMODULATION SIDEBAND SUPPRESSION AND POST-DEMODULATION SIDEBAND RESTORATION

[75] Inventor: Etsurou Sakamoto, Kanagawa, Japan

[73] Assignee: Sony Corporation, Tokyo, Japan

[21] Appl. No.: 653,614

[22] Filed: Feb. 11, 1991

[30] Foreign Application Priority Data

Feb. 15, 1990 [JP] Japan .................................. 2-34729

[51] Int. Cl.$^5$ .............................................. H04N 5/21
[52] U.S. Cl. .................................. 358/330; 358/327; 358/23; 329/318; 329/341; 375/12
[58] Field of Search ............... 329/341, 343, 342, 318, 329/320; 375/12, 15; 333/18; 364/724.2; 358/336, 23, 314, 330, 327, 340, 162; 360/60

[56] References Cited

U.S. PATENT DOCUMENTS

| | | | |
|---|---|---|---|
| 4,205,335 | 5/1980 | Nakagawa et al. | 358/23 |
| 4,298,983 | 11/1981 | Kawai et al. | 375/14 |
| 4,591,930 | 5/1986 | Baumeister | 358/340 |
| 4,843,334 | 6/1989 | Ishikawa et al. | |
| 4,906,942 | 3/1990 | Nakai et al. | 358/327 |
| 4,926,133 | 5/1990 | Koga | 329/342 |
| 4,959,620 | 9/1990 | Honjo | 329/342 |
| 5,067,026 | 11/1991 | Kaneko | 358/340 |
| 5,084,767 | 1/1992 | Watanabe et al. | 358/340 |
| 5,088,109 | 2/1992 | Schenk | 333/18 |

FOREIGN PATENT DOCUMENTS 0184486 7/1988 Japan .
0244877 9/1990 Japan .

OTHER PUBLICATIONS

IEEE Transactions on Consumer Electronics, vol. 34, No. 1, Feb. 1988, New York, N.Y., USA, pp. 78-83; Masami Itoga et al.: "Two Channel FM Recording for High-Definition Baseband Signals."
Patent Abstracts of Japan, vol. 11, No. 204 (E-520) (2651), 2 Jul. 1986 and JP-A-62 026 990 (Sony Corp.), 4 Feb. 1987.
Patent Abstracts of Japan, vol. 13, No. 482 (P-953), 2 Nov. 1989, and JP-A-1 192 062 (Mitsubishi Electric Corp.), 2 Aug. 1989.

Primary Examiner—James J. Groody
Assistant Examiner—Jeffrey S. Murrell
Attorney, Agent, or Firm—Philip M. Shaw, Jr.

[57] ABSTRACT

An FM demodulating apparatus suitable for use in a VTR or the like has a suppressing circuit for suppressing the upper and lower sideband components of an FM modulated video signal, an FM demodulation circuit for demodulating the output from the suppressing circuit and a recovering circuit connected to the output of the FM demodulation circuit for recovering the sideband components suppressed by the suppressing circuit, to thereby provide a favorable demodulation.

10 Claims, 3 Drawing Sheets

FIG. 5A Input Signal

FIG. 5B Delay Signal

FIG. 5C Output Signal

DEMODULATOR FOR FM MODULATED VIDEO SIGNALS WITH PRE-DEMODULATION SIDEBAND SUPPRESSION AND POST-DEMODULATION SIDEBAND RESTORATION

BACKGROUND OF THE INVENTION

1. Field of the Invention

The present invention relates generally to an FM demodulating apparatus, and more particularly, to an FM demodulating apparatus of this kind which is suitable for use in demodulation or the like of video signals recorded by, for example, a video tape recorder (hereinafter simply called "VTR") by an FM modulation (frequency modulation).

2. Description of the Prior Art

Conventionally, video signals recorded on a magnetic tape by FM modulation are reproduced from the magnetic tape and FM demodulated, for example, in a VTR (video tape recorder). More specifically, as shown in FIG. 1, a reproduced video signal fed to an input terminal 1 is supplied to an RF signal equalizer (RF equalizer) 2 wherein characteristics of sideband components of the reproduced video signal are equalized so as to be equivalent to the modulation figure of an FM modulation signal upon recording. Then, the output from the RF signal equalizer 2 is supplied to an FM demodulation circuit 3 to be FM demodulated. In that event, as the FM demodulation circuit 3, for example, a pulse counter type FM demodulation circuit is used. The demodulated output from the FM demodulation circuit 3 is delivered to a demodulated video signal output terminal 4.

Such an FM demodulating apparatus demodulates a signal with a wide range of modulation figures so that reproduction of upper sideband components may easily fluctuate due to conditions of reproducing heads and a magnetic tape and so on of a VTR, which causes dropout of information called reverse phenomenon and accordingly easy generation of noise on the demodulated signal.

Also, employment of a pulse count type FM demodulation circuit as an FM demodulation circuit results in generating a large amount of undesirable components called moire on the demodulated signal in the vicinity of the frequency double the carrier frequency.

OBJECTS AND SUMMARY OF THE INVENTION

Therefore, it is an object of the present invention to provide an FM demodulating apparatus which is capable of performing favorable demodulation.

In accordance with a first aspect of the present invention, the FM demodulating apparatus receives an FM modulated video signal having upper and lower sideband components, and is comprised of a first equalizer for suppressing the upper and lower sideband components of the FM modulated video signal an FM demodulator circuit connected to the first equalizer, wherein the FM demodulator circuit is a pulse counter type FM demodulator, and a second equalizer receiving the demodulated signal from the FM demodulator circuit for recovering the upper and lower sideband components suppressed by the first equalizer and or deriving an output video signal.

In accordance with a second aspect of the present invention, the FM demodulating apparatus receives an FM modulated video signal, the FM modulated video signal having a center frequency and upper and lower sideband components, the FM modulated video signal being devised from a recording of an original FM modulated video signal. The FM demodulating apparatus comprises a first equalizer for equalizing the FM modulated video signal to make the modulation figure of the sideband components of the FM modulated video signal substantially equal to the modulation figure of the original FM modulated video signal. The demodulating apparatus additionally comprises a second equalizer that suppresses the upper and lower sideband components of the FM modulated video signal from the first equalizer, the second equalizer means having a frequency characteristic that is substantially symmetrical about the enter frequency of the FM modulated video signal. The demodulating apparatus further comprises an FM demodulator that demodulates the equalized FM modulated video signal from the second equalizer. Finally, the demodulating apparatus comprises a third equalizer that receives the demodulated video signal from the FM demodulator and recovers the upper and lower sideband components suppressed by the second equalizer.

The above and other objects, features, and advantages of the present invention will become apparent from the following detailed description of an illustrative embodiment thereof to be read in conjunction with the accompanying drawings, in which like reference numerals represent the same or similar objects.

BRIEF DESCRIPTION OF THE DRAWINGS

FIGS. 5A to 5C are waveform diagrams used for explaining the operation of the demodulation circuit illustrated in FIG. 4.

DETAILED DESCRIPTION OF THE PREFERRED EMBODIMENT

Figure 1:
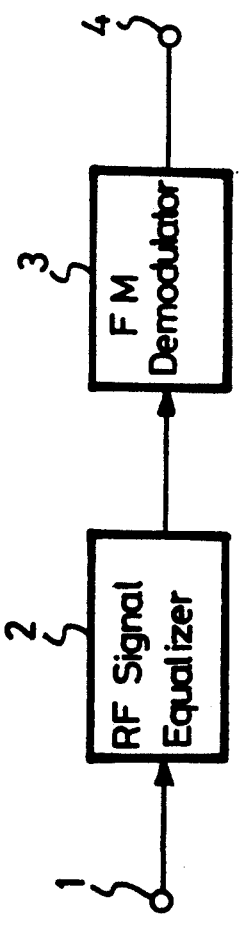
FIG. 1 is a schematic block diagram showing the configuration of an example of conventional demodulating apparatus.

Now, an embodiment of the FM demodulating apparatus according to the present invention will hereinafter be described with reference to FIGS. 2 to 6. In these drawings, parts corresponding to those in FIG. 1 are designated with the same reference numerals and detailed explanation thereof will be omitted.

Figure 2:
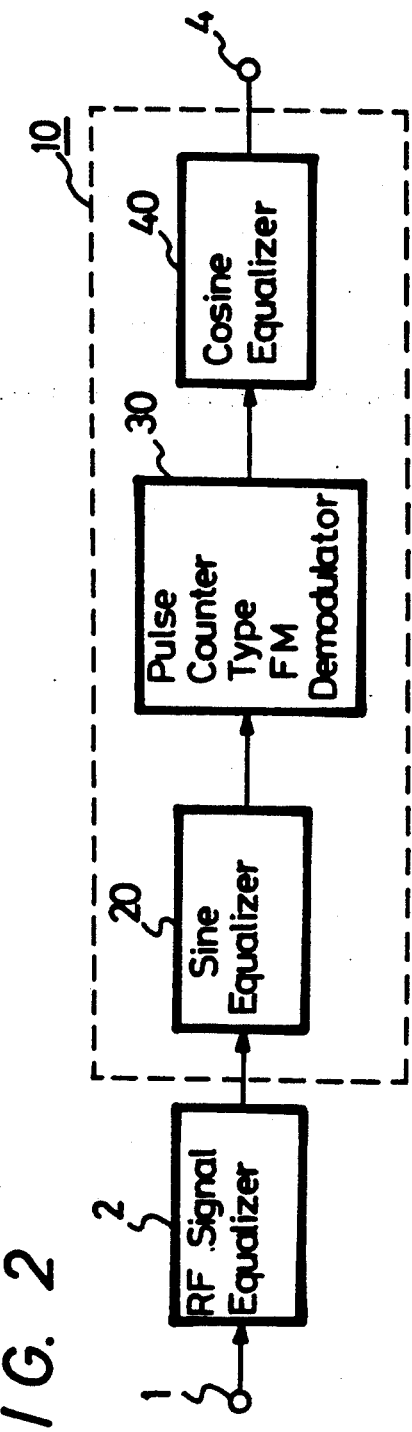
FIG. 2 is a structural block diagram showing the configuration of an embodiment of the FM demodulating apparatus according to the invention.

In the present embodiment as shown in FIG. 2, characteristics of side band components of a reproduced video signal fed to an input terminal 1 are equalized by an RF signal equalizer 2 so as to be equivalent to the modulation figure of the recorded FM modulation signal, and then the equalized output video signal from the RF signal equalizer 2 is supplied to the FM demodulating apparatus 10.

Figure 3:
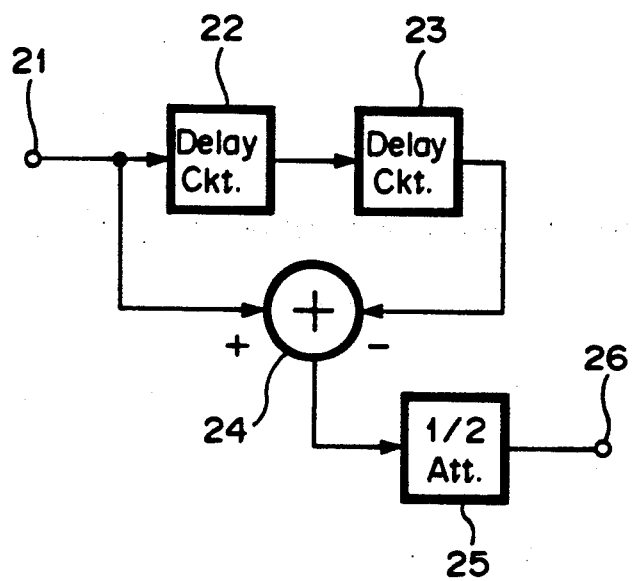
FIG. 3 is a circuit block diagram showing a sine equalizer employed in the embodiment shown in FIG. 2.

The FM demodulating apparatus 10 comprises a sine equalizer 20, a pulse counter type FM demodulation circuit 30 and a cosine equalizer 40. The output video signal from the RF signal equalizer 2 is supplied to the sine equalizer 20 which functions as a bandpass filter of suppressing sideband components for the carrier of the FM modulated signal. The sine equalizer 20 is constructed as shown in FIG. 3, for example.

More specifically, a signal fed to a terminal 21 is supplied to a series circuit composed of two delay circuits 22, 23 for providing a delay amount $\tau$ ($\tau$ is the unit delay amount). Then, the signal supplied to the terminal 21 and the output signal from the delay circuit 23 are supplied to a subtractor 24 to subtract the signal delayed by the delay circuits 22, 23 from the input signal. The subtraction output from the subtractor 24 is delivered to an output terminal 26 through a ½ attenuator 25.

By thus constructing the sine equalizer 20, the output characteristic of the sine equalizer is expressed by the following equation:

$$\text{Output/Input} = e^{-j\omega\tau} \cdot j \cdot \sin\omega\tau$$

Thus, the peak ($\frac{1}{4}\tau$) of the sine wave is substantially equal to the central frequency of the carrier so that the sine equalizer 20 functions as a bandpass filter for suppressing sideband components for the carrier.

The output from the sine equalizer 20 is then supplied to a pulse count type FM demodulation circuit 30.

Figure 4:
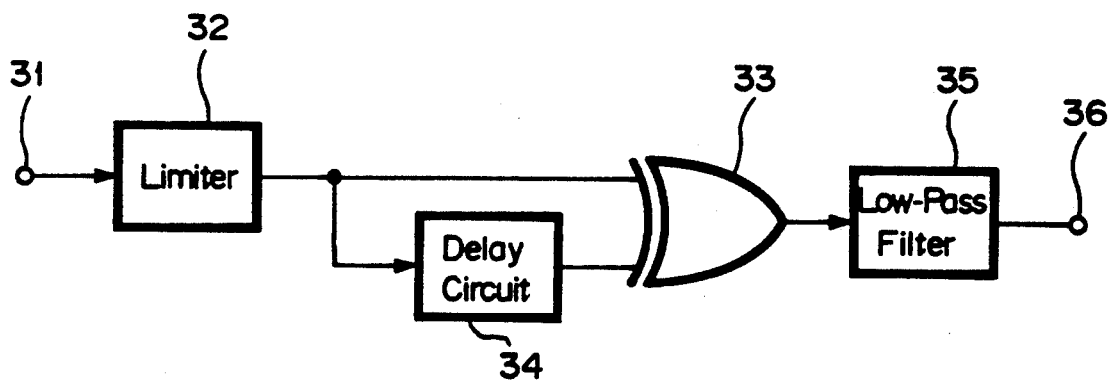
FIG. 4 is a circuit block diagram showing the configuration of a pulse count type FM demodulation circuit employed in the embodiment.

FIG. 4 shows the configuration of a practical example of the pulse count type FM demodulation circuit 30. An FM modulated signal supplied from the sine equalizer 20 to an input terminal 31 is band limited by a limiter 32 and thereafter supplied directly to an Exclusive-OR gate 33 as well as to the Exclusive-OR gate 33 through a delay circuit 34. An exclusive logical OR outputted from the Exclusive-OR gate 33 is delivered to an output terminal 36 through a low pass filter 35.

By thus constructing the FM demodulation circuit 30, when an FM modulated signal as shown in FIG. 5A is supplied to the input terminal 31, the Exclusive-OR circuit 33 derives an exclusive logical OR of the input signal and the signal of the input signal delayed by the delay circuit 34 shown in FIG. 5B, and a pulse signal shown in FIG. 5C is outputted from the Exclusive-OR circuit 33. As can be seen from FIGS. 5A to 5C, the number of the output pulses varies in accordance with the frequency of input signal. Demodulated signals are therefore derived by supplying the output pulses of the Exclusive-OR circuit 33 to the low pass filter 35 and averaging the same thereby.

Figure 6:
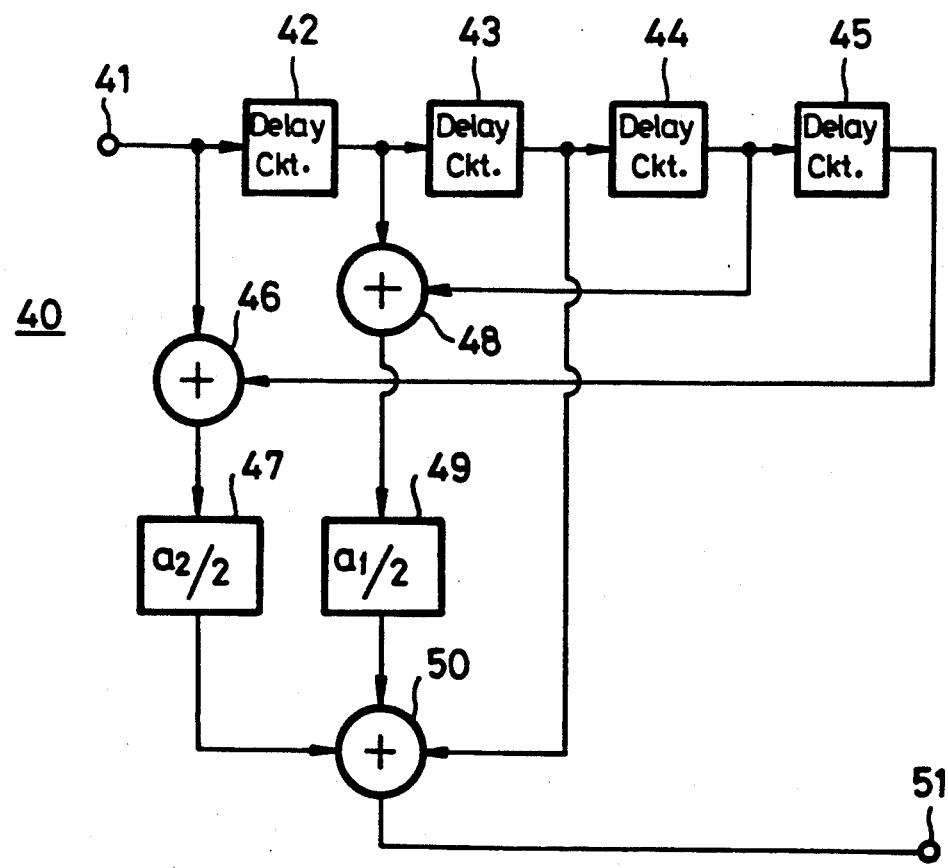
FIG. 6 is a circuit block diagram showing a cosine equalizer employed in the embodiment.

The output signal from the FM demodulation circuit 30 thus constructed is supplied to the cosine equalizer 40 which is provided for recovering the sideband components suppressed by the sine equalizer 20 and constructed as shown in FIG. 6.

More specifically, a signal fed to a terminal 41 is supplied to a series circuit composed of four delay circuits 42, 43, 44 and 45 respectively having a delay amount $\tau$. Then, the signal fed to the terminal 41 and the output signal from the delay circuit 45 are supplied to an adder 46 to be added. The addition output from the adder 46 is next supplied to an adder 50 through a coefficient multiplier 47 for multiplying a supplied signal by a coefficient ($a_2/2$). Also, the output signal from the delay circuit 42 and the output signal from the delay circuit 44 are supplied to an adder 48 to be added. The addition output from the adder 48 is supplied to the adder 50 through a coefficient multiplier 49 for multiplying a supplied signal by a coefficient ($a_1/2$). Further, the output signal from the delay circuit 43 is also supplied to the adder 50 which in turn delivers the addition output thereof to an output terminal 51.

By thus constructing the cosine equalizer 40, its output characteristic is expressed by the following equation:

$$\text{Output/Input} = (1 + a_1 \cdot \cos\omega\tau + a_2 \cdot \cos 2\omega\tau) \, e^{-j2\omega\tau}$$

It will be therefore understood that the sideband components suppressed by the sine equalizer 20 is recovered by the cosine equalizer 40. The output from the cosine equalizer 40 is then delivered to an output terminal 4 as a demodulated output by the FM demodulating apparatus 10.

Now, reference will be made to the operation of the FM demodulating apparatus 10 thus constructed. First, an inputted FM modulated signal S(t) fed to the terminal 1 is expressed by the following equation (1):

$$S(t) = \sin\left(\omega_0 t + \frac{\Delta\omega_D}{\omega} \cdot \sin\omega t\right) \quad (1)$$

where $\frac{\Delta\omega_D}{\omega}$ = modulation figure $\beta$

With the above equation (1), if the modulation FIG. $\beta$ is assumed to be small, the following equation (2) is satisfied:

$$S(t) = \sin\omega_0 t + \frac{\beta}{2}\{\sin(\omega_0 + \omega)t - \sin(\omega_0 - \omega)t\} \quad (2)$$

Also, if gains upon equalization performed by the RF equalizer 2 are represented by $\rho\pm$, an input $S_1(t)$ to the sine equalizer 20 is expressed by the following equation (3):

$$S_1(t) = \sin\omega_0 t + \frac{\beta}{2} \cdot \rho_+ \cdot \sin(\omega_0 + \omega)t - \frac{\beta}{2} \cdot \rho_- \cdot \sin(\omega_0 - \omega)t \quad (3)$$

An output $S_2(t)$ from the sine equalizer 20 is expressed by the following equation (4) where the output $S_2(t)$ is normalized by the carrier frequency:

$$S_2(t) = \sin\omega_0 t + \frac{\beta}{2} \cdot \rho_+ \cdot \frac{\sin(\omega_0 + \omega)\tau}{\sin\omega_0\tau} \cdot \sin(\omega_0 + \omega)t - \quad (4)$$
$$\frac{\beta}{2} \cdot \rho_- \cdot \frac{\sin(\omega_0 - \omega)\tau}{\sin\omega_0\tau} \sin(\omega_0 + \omega)t$$

An output v(t) from the FM demodulation circuit 30 is approximately expressed by the following equation (5):

$$v(t) \approx \left( \frac{\beta}{2} \cdot \rho_+ \cdot \frac{\sin(\omega_0 + \omega)\tau}{\sin\omega_0\tau} + \frac{\beta}{2} \cdot \rho_- \cdot \frac{\sin(\omega_0 - \omega)\tau}{\sin\omega_0\tau} \right) \cdot \omega \cdot \cos\omega t \quad (5)$$

$$= \Delta\omega_D \cdot \left( \frac{\rho_+ + \rho_-}{2} \cdot \cos\omega\tau + \frac{\rho_+ - \rho_-}{2} \cdot \sin\omega\tau \cdot \cot\omega_0\tau \right) \cdot \cos\omega t$$

From the above equations the frequency characteristic $Gv(\omega)$ of the output $v(t)$ from the FM demodulation circuit 30 is expressed by the following equation (6):

$$Gv(\omega) = \frac{\rho_+ + \rho_-}{2} \cdot \cos\omega\tau + \frac{\rho_+ - \rho_-}{2} \cdot \cot\omega_0\tau \cdot \sin\omega\tau \quad (6)$$

where $\omega_0 + \omega < \frac{\pi}{\tau}$

The frequency characteristic $Gv(\omega)$ of the demodulated signal, when the upper and lower sideband components are equalized to have the same amplitude, that is, when $\rho_+ = \rho_- = 1$ stands, is given by the following equation (7):

$$Gv(\omega) = \cos\omega\tau \quad (7)$$

On the other hand, when the upper and lower sideband components are not equal, that is, when $\rho_+ = \rho_+ = 1 - \Delta\rho$, $\rho_- = 1 + \Delta\rho$ stand, the frequency characteristic $Gv(\omega)$ of the demodulated signal is given by the following equation (8):

$$Gv(\omega) = \cos\omega\tau - \Delta\rho\cos\omega_0\tau \cdot \sin\omega\tau \quad (8)$$

Incidentally, since $\omega_0\tau \approx \pi/2$ is satisfied $\cos\omega_0\tau < 1$ stands. Also, with respect to $\Delta\rho$, $\Delta\rho < 1$ is satisfied so that the following equation (9) is defined:

$$Gv(\omega) = \cos\omega\tau \quad (9)$$

It is therefore appreciated that if a demodulated signal outputted from the FM demodulation circuit 30 is corrected by characteristics of $1/\cos\omega\tau$, the sideband components of the demodulated signal is recovered, and therefore the frequency characteristic thereof becomes flat.

In the present embodiment, the cosine equalizer 40 is constructed, as shown in FIG. 6, so as to have the characteristics of $1/\cos\omega\tau$, thereby making it possible to derive a demodulated signal with flat frequency characteristics at the demodulated signal output terminal 4 of the FM demodulating apparatus 10 through the cosine equalizer 40.

By thus performing the FM demodulation, when demodulation is performed by the FM demodulation circuit 30, both sideband components have been suppressed by the sine equalizer 20, so that the modulation figure is equivalently lowered and fluctuations in amplitude are reduced, whereby a margin for distortion of the modulated signal is increased, which results in performing a favorable demodulation without reverse phenomenon even if a contact condition between the head and tape is changed and thereby distortion occurs in the reproduced signal, for example, upon reproducing by a VTR. The demodulated signal is recovered to have the original frequency characteristics by the cosine equalizer 40 so that the frequency characteristics of the demodulated signal will never be disturbed.

The pulse count type demodulator employed as the FM demodulation circuit 30 in the present embodiment inconveniently generates undesirable components called moire at a frequency double the carrier frequency, however, the construction of the present embodiment can equivalently lower the modulation figure and therefore prevent such moires from occurring.

Incidentally, the above described embodiment employs a sine equalizer as a suppressing means for suppressing sideband components of FM modulated signals prior to FM demodulation. However, the sideband components may be suppressed by an ordinary bandpass filter. Also, as means for recovering the sideband components after FM demodulation, any filter circuit may be used as long as it has characteristics which permits recovering the suppressed sideband components to the original form.

According to the FM demodulating apparatus of the present invention as described above, since sideband components of FM modulated video signals are suppressed before demodulation performed by an FM demodulation circuit, the equivalent modulation figure is lowered and a margin for distortion of modulated signals is increased, thereby making it possible to achieve favorable demodulation. The suppressed sideband components are recovered to have the original frequency characteristics after demodulation, which results in avoiding disturbance of the frequency characteristics of the demodulated signals.

Having described a preferred embodiment of the present invention with reference to the accompanying drawings, it is to be understood that the invention is not limited to the precise embodiment and that various changes and modifications could be effected by one skilled in the art without departing from the spirit or scope of the novel concepts of the invention as defined in the appended claims.

I claim as my invention:

1. An FM demodulating apparatus receiving an FM modulated video signal having upper and lower sideband components, comprising:
   (a) a first equalizer means for suppressing the upper and lower sideband components of the FM modulated video signal;
   (b) an FM demodulator circuit connected to the first equalizer, wherein the FM demodulator circuit is a pulse counter type FM demodulator; and
   (c) a second equalizer means for receiving the demodulated video signal from the FM demodulator circuit, for recovering the upper and lower sideband components suppressed by the fist equalizer means and for deriving an output video signal.

2. An FM demodulating apparatus as cited in claim 1, wherein the first equalizer means has a band-pass characteristic.

3. An FM demodulating apparatus as cited in claim 2, wherein the first equalizer means is a sine equalizer and the second equalizer mean is a cosine equalizer.

4. An FM demodulating apparatus as cited in claim 2, wherein the firs equalizer means is a sine equalizer having a frequency characteristic of $e^{-j\omega\tau} \cdot j \cdot \sin\omega\tau$.

5. An FM demodulating apparatus as cited in claim 4, wherein the second equalizer means is a cosine equalizer having a frequency characteristic of $(1+a_1 \cos\omega\tau + a_2 \cos2\omega\tau) \cdot e^{j2\omega\tau}$.

6. An FM demodulating apparatus receiving an FM modulated video signal, the FM modulated video signal having a center frequency and upper and lower sideband components, and being derived from a recording of an original FM modulated video signal, the FM demodulating apparatus comprising:
   (a) a first equalizer means for equalizing the FM modulated video signal to make the modulation figure of the side-band components of the FM modulated video signal substantially equal to the modulation figure of the original FM modulated video signal;
   (b) a second equalizer means for suppressing the upper and lower sideband components of the FM modulated video signal from the first equalizer means, the second equalizer means having a frequency characteristic that is substantially symmetrical about the center frequency of the FM modulated video signal;
   (c) an FM demodulator means for demodulating the equalized FM modulated video signal from the second equalizer means; and
   (d) a third equalizer means, receiving the demodulated video signal from the FM demodulator means, for recovering the upper and lower sideband components suppressed by the second equalizer means.

7. An FM demodulating apparatus as cited in claim 6, wherein the second equalizer means has a band-pass characteristic.

8. An FM demodulating apparatus as cited in claim 7, wherein the second equalizer means is a sine equalizer and the third equalizer means is a cosine equalizer.

9. An FM demodulating apparatus as cited in claim 7, wherein the second equalizer means is a sine equalizer having a frequency characteristic of $e^{-j\omega\tau} \cdot j \cdot \sin\omega\tau$.

10. An FM demodulating apparatus as cited in claim 7, wherein the third equalizer means is a cosine equalizer having a frequency characteristic of $(1+a_1 \cdot \cos\omega\tau + a_2 \cdot \cos2\omega\tau) \cdot e^{j2\omega\tau}$.

* * * * *